(12) United States Patent
O'Brien et al.

(10) Patent No.: US 8,056,029 B2
(45) Date of Patent: Nov. 8, 2011

(54) MERGING SUB-RESOLUTION ASSIST FEATURES OF A PHOTOLITHOGRAPHIC MASK

(75) Inventors: Sean C O'Brien, Dallas, TX (US); Guohong Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 490 days.

(21) Appl. No.: 12/244,917

(22) Filed: Oct. 3, 2008

(65) Prior Publication Data

US 2009/0029272 A1 Jan. 29, 2009

Related U.S. Application Data

(62) Division of application No. 11/114,558, filed on Apr. 26, 2005, now Pat. No. 7,451,428.

(60) Provisional application No. 60/655,939, filed on Feb. 24, 2005.

(51) Int. Cl.
*G06F 17/50* (2006.01)
(52) U.S. Cl. .......... 716/56; 716/50; 716/53; 716/55
(58) Field of Classification Search .......... 716/50, 716/53, 55–56
See application file for complete search history.

(56) References Cited

U.S. PATENT DOCUMENTS

| 6,074,787 A | 6/2000 | Takeuchi |
|---|---|---|
| 2002/0155357 A1 | 10/2002 | LaCour |
| 2004/0078763 A1 | 4/2004 | Lippincott |
| 2005/0208396 A1 | 9/2005 | Lippincott |

OTHER PUBLICATIONS

UMC and Synopsys Develop Reference Flow for UMC's Advanced Deep Submicron Processes, Collaboration Validates Synopsys' Galaxy Design Platform for UMC's 0.13 micron Process, Synopsys, Inc., Corporate, Copyright © 2005 Synopsys, Inc., http://www.synopsys.com, 2 pages.

Mentor Graphics Calibre Approved Verification Tool for IBM-Chartered 90nm Design Enablement Platform, www.mentor.com, Copyright © 2002, Mentor Graphics Corporation, 8 pages.

TSMC and Synopsys Address Design Challenges for 90 Nanometer and Below with TSMC Reference Flow 5.0, Synopsys, Inc., Corporate, Copyright © 2005 Synopsys, Inc., http://www.synopsys.com, 3 pages.

Mask Tools, Products/Profile, ASML Mask Tools, Copyright © 2005 ASML, www.masktools.com, 13 pages.

Hercules Physical Verification Suite (PVS) The Industry's Fastest Physical Verification Solution, Synopsys, Inc. Products & Solutions, Copyright © 2005 Synopsys, Inc., http://www.synopsys.com, 4 pages.

Product Overview, K2 Technologies, Copyright © 1995-2004, Cadence Design Systems, Inc., 37 pages.

Pending Patent Application filed Apr. 26, 2005, entitled "Modifying Merged Sub-Resolution Assist Features of a Photolithographic Mask", 40 pages specification, claims and abstract 3 pages of drawings, inventors Sean C. O'Brien et al.

*Primary Examiner* — Stacy Whitmore
(74) *Attorney, Agent, or Firm* — Jacqueline J. Garner; Wade J. Brady, III; Frederick J. Telecky, Jr.

(57) ABSTRACT

Merging sub-resolution assist features includes receiving a mask pattern that includes the sub-resolution assist features. A first sub-resolution assist feature is selected to merge with a second sub-resolution assist feature. A merge bar width of a merge bar is established. A distance between the first sub-resolution assist feature and the second sub-resolution assist feature is determined. A merging technique is determined in accordance with the distance and the merge bar width. The first sub-resolution assist feature and the second sub-resolution assist feature are merged according to the identified merging technique.

8 Claims, 3 Drawing Sheets

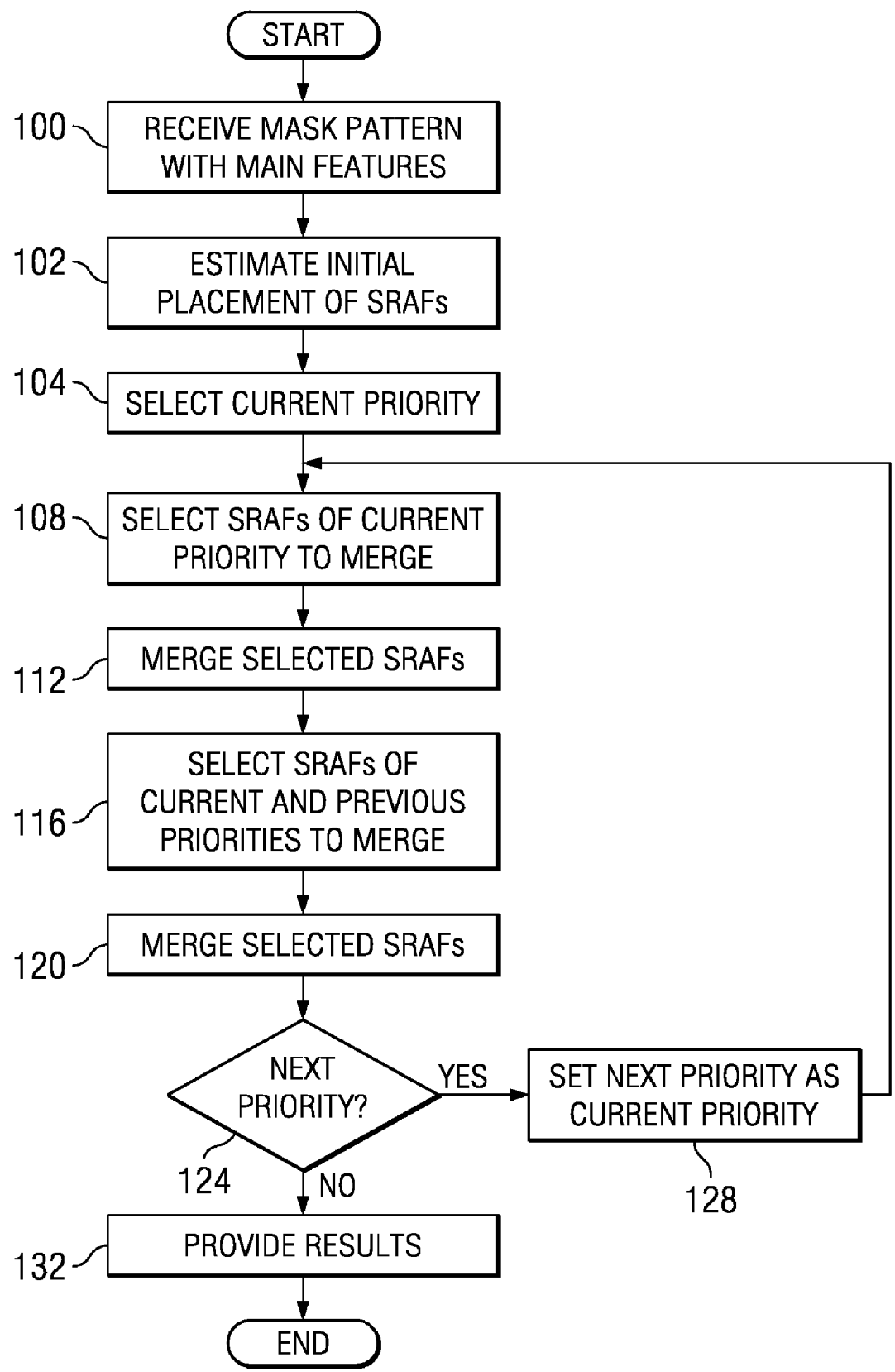

MERGING SUB-RESOLUTION ASSIST FEATURES OF A PHOTOLITHOGRAPHIC MASK

RELATED APPLICATION

This application claims benefit under 35 U.S.C. §119(e) of U.S. Provisional Application Ser. No. 60/655,939, entitled "CONFLICT RESOLUTION FOR SUB-RESOLUTION ASSIST FEATURES FOR GATE LEVELS," filed Feb. 24, 2005.

TECHNICAL FIELD

This invention relates generally to the field of photolithography and more specifically to merging sub-resolution assist features of a photolithographic mask.

BACKGROUND

Masks are used to define patterns on objects. For example, photomasks are used in photolithographic systems to define patterns on semiconductor wafers to manufacture integrated circuits. Processing situations, however, may distort the resulting pattern defined on the object. For example, optical diffraction may cause the pattern defined on a wafer to differ from the pattern of the mask.

A mask may include features that compensate for distortions of a resulting pattern on a wafer. According to a known technique for compensating distortions, a mask may include sub-resolution assist features (SRAFs). An SRAF is designed to improve the process margin of a resulting wafer pattern, but not to be printed on the wafer. In certain situations, however, the SRAFs may be unsatisfactory. For example, the SRAFs may print on a wafer or may violate mask rules. It is generally desirable to have satisfactory SRAFs.

SUMMARY OF THE DISCLOSURE

In accordance with the present invention, disadvantages and problems associated with previous techniques for merging SRAFs may be reduced or eliminated.

According to one embodiment of the present invention, merging sub-resolution assist features includes receiving a mask pattern that includes the sub-resolution assist features. A first sub-resolution assist feature is selected to merge with a second sub-resolution assist feature. A merge bar width of a merge bar is established. A distance between the first sub-resolution assist feature and the second sub-resolution assist feature is determined. A merging technique is determined in accordance with the distance and the merge bar width. The first sub-resolution assist feature and the second sub-resolution assist feature are merged according to the identified merging technique.

Certain embodiments of the invention may provide one or more technical advantages. A technical advantage of one embodiment may be that merging SRAFs may reduce rule violations. Reducing rule violations may yield a wafer pattern that is more readily achieved. Another technical advantage of one embodiment may be that the SRAFs may be merged in a manner that at least reduces the printability of the merged SRAFs. Typically, SRAFs are designed to not print on the wafer. Yet another technical advantage of one embodiment may be that merging SRAFs may yield a mask that is less expensive to produce.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 3 is a flowchart illustrating one embodiment of a method for merging SRAFs that may be used by the system of FIG. 2; and FIGS. 4A through 6 illustrate example merging techniques for merging SRAFs that may be used with the method of FIG. 3;

FIG. 4A is a diagram illustrating a first example merging technique for merging SRAFs that are separated by a distance less than a merge bar width;

FIG. 5 is a diagram illustrating a second example merging technique for merging SRAFs that are separated by a distance greater than the merge bar width; and FIG. 6 is a diagram illustrating a third example merging technique for merging SRAFs that overlap by a distance greater than the merge bar width.

DETAILED DESCRIPTION OF THE DRAWINGS

Embodiments of the present invention and its advantages are best understood by referring to FIGS. 1 through 6 of the drawings, like numerals being used for like and corresponding parts of the various drawings.

Figure 1:
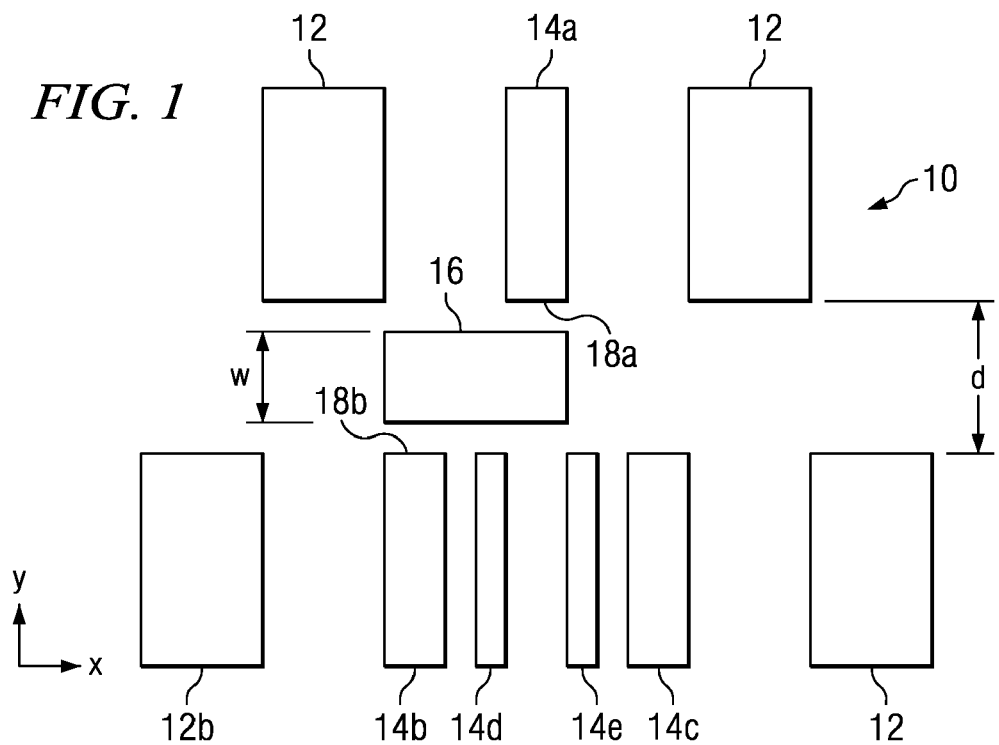
FIG. 1 is a diagram illustrating an example pattern for a mask that includes sub-resolution assist features (SRAFs) that may be merged according to one embodiment of the invention.

FIG. 1 is a diagram illustrating an example pattern 10 for a mask that includes sub-resolution assist features (SRAFs) that may be merged according to one embodiment of the invention. According to the embodiment, certain SRAFs may be selected for merging, and a merge bar may be used to merge the selected SRAFs. The SRAFs may be merged in a manner that at least maintains the process margin for the features, while at least reducing the possibility of yielding a printed feature on a wafer.

A mask may refer to a photomask used in a photolithographic system to define a pattern on an object such as a semiconductor wafer to form an integrated circuit. Typically, a mask is placed between a light source and the object. The mask selectively blocks, transmits, or otherwise modifies light from the light source to define a pattern on the object. A mask pattern may refer to a pattern of all or a portion of the mask that defines the pattern on the object.

A mask has a background on which features are defined. A dark field mask has an opaque background on which clear features are defined. A clear feature may refer to a feature that substantially transmits light through an otherwise opaque mask. A clear field mask has a clear background on which opaque features are defined. An opaque feature may refer to a feature that substantially blocks light from passing through an otherwise transparent mask.

Clear portions may comprise any suitable substantially transparent material operable to substantially transmit light. For example, clear portions may comprise glass, film, other suitable clear material, or any combination of the preceding. Opaque portions may comprise any suitable substantially opaque material operable to substantially block light. For example, opaque portions may comprise silver, chrome, chrome oxide, iron oxide, copper, aluminum, silicon oxide, other suitable opaque material, or any combination of the preceding.

According to the illustrated embodiment, example mask pattern 10 includes opaque features such as main features 12 and SRAFs 14. A main feature may refer to a feature of a mask that is designed to yield a printed main feature on a wafer. The capability of a feature to yield a printed feature on a wafer may be referred to as printability. Accordingly, a main feature may refer to a feature that is designed to be printable.

According to one embodiment, main feature 12 may represent an opaque feature such as a gate of a transistor. In the illustrated example, the transverse axis of each gate is substantially parallel to an x-axis, and the longitudinal axis of each gate is substantially parallel to an y-axis. For gates, the distance between gates in the x-direction is more important the distance between gates in the y-direction. Although main feature 12 is described as representing a gate, main feature 12 may represent any suitable feature of a mask that is designed to be printable. For example, main feature 12 may represent transistor silicon, a metal interconnect, or a polysilicon interconnect.

Example mask pattern 10 also includes SRAFs 14a-e. An SRAF may refer to a feature of a mask that is designed to improve the process margin of a printed main feature on a wafer, but not to yield a printed feature on the wafer. That is, an SRAF may refer to a feature that is designed to be not printable. Process margin refers to the range of exposure dose and defocus over which acceptable image size tolerances can be maintained. According to one embodiment, an SRAF 14 may comprise a grating that scatters light away from a printed main feature 12 of the wafer. SRAF 14, however, may represent any suitable feature of a mask that is designed to be not printable. For example, SRAF 14 may represent an L-shaped, square-shaped, or other suitably shaped feature of any suitable tone such as clear or dark.

SRAFs 14a-e include primary SRAFs 14a-c and secondary SRAFs 14d-e. A primary SRAF 14b for a main feature 12b may be larger than secondary SRAF 14d, and may be closer than secondary SRAF 14d to feature 12b. Primary SRAF 14b may provide more improvement than secondary SRAF 14d. Accordingly, primary SRAFs 14a-c may have a higher priority than secondary SRAFs 14d-e. Although two priorities are described, SRAFs 14 may have only one or more than two priorities.

SRAFs 14 may be merged. Merging SRAFs 14 may refer to coupling SRAFs 14 with a material having similar properties as those of SRAFs 14 to form, in effect, one feature. SRAFs 14 and merged SRAFs 14 that are shaped like a rectangle, square, or L are typically not printable. Merged SRAFs 14 of other shapes, however, may be printable. Accordingly, these merged SRAFs 14 may be adjusted to avoid yielding a printed feature.

SRAFs 14 may be selected to be merged if SRAFs 14 violate a rule. A rule may refer to a mask rule, process rule, or any other suitable rule. For example, SRAFs 14a-b may be merged if the space between SRAFs 14a-b is less than a minimum spacing value. A minimum spacing value may define the minimum acceptable distance between features of a mask. SRAFs 14 may also be merged to simplify a mask or printing pattern.

More than two SRAFs 14 may be candidates for merging. If more than two SRAFs 14 may be merged, two SRAFs 14 may be selected to be merged. For example, if SRAFs 14a-c may be merged, but SRAFs 14a-b are closer together than SRAFs 14a-c, then SRAFs 14a-b may be selected to be merged. The other SRAF 14c may be shortened.

According to one embodiment, a merge bar 16 may be used to merge SRAFs 14a-b. Merge bar 16 may represent a feature used to couple SRAFs 14, and may comprise material of substantially the same properties as SRAFs 14. Merge bar 16 may have a merge bar width w. According to the embodiment, width w may be greater than a minimum spacing value and less than a minimum print rule. A minimum printability value may define the minimum acceptable width of a printable feature. Accordingly, width w may allow merge bar 16 to merge SRAFs 14 that violate the minimum spacing value, while remaining not printable. According to one embodiment, a minimum spacing value may be approximately 25 nanometers, a minimum printability value may be approximately 45 nanometers, and width w may be between 25 and 45 nanometers, such as approximately 30 nanometers.

A distance d in the y-direction between SRAFs 14a-b may be used to determine a merging technique for merging SRAFs 14a-b. Distance d between SRAFs 14a-b may refer to the distance in the y-direction between ends 18a-b of SRAFs 14a-b, respectively, that are in closest proximity to each other in the y-direction. A merging technique may refer to a procedure for coupling SRAFs 14 with a merge bar 16. Examples of merging techniques are described in more detail with reference to FIGS. 3 through 6.

Example pattern 10 is presented as an example only. Modifications, additions, or omissions may be made to pattern 10 without departing from the scope of the invention. Pattern 10 may include more, fewer, or other features. Additionally, features may arranged in any suitable manner without departing from the scope of the invention.

Figure 2:
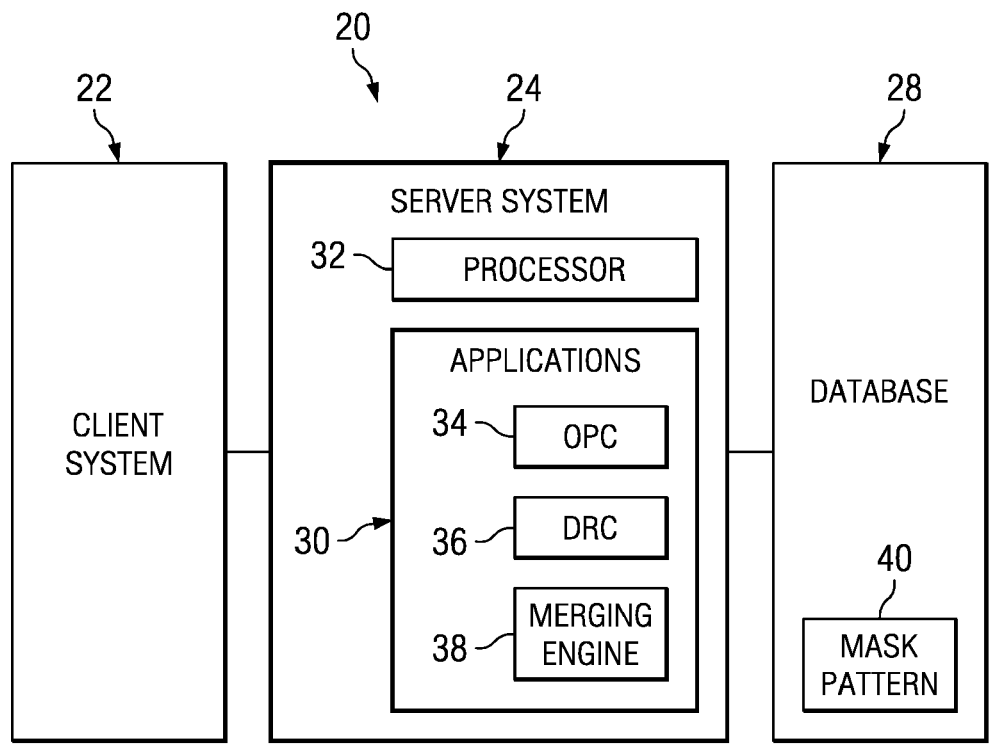
FIG. 2 is a block diagram illustrating one embodiment of a system operable to merge SRAFs.

FIG. 2 is a block diagram illustrating one embodiment of a system 20 operable to merge SRAFs 14. According to the embodiment, system 20 may select certain SRAFs 14 for merging, and may be use a merge bar 16 to merge the selected SRAFs 14. System 20 may merge SRAFs 14 in a manner that at least maintains the process margin for the features, while at least reducing the possibility of yielding a printed feature on a wafer.

According to the illustrated embodiment, system 20 includes a client system 22, a server system 24, and a database 28 coupled as shown. According to one embodiment, client system 22 allows a user to communicate with server system 24 to execute applications that may be used to merge SRAFs 14. Client system 22 may include any hardware, software, other logic, or any combination of the preceding for communicating with server system 24, and may use any of a variety of computing structures, arrangements, and compilations to communicate with server system 24.

Server system 24 manages applications 30 that may be used to merge SRAFs 14. Server system 24 may include any hardware, software, other logic, or any combination of the preceding for managing applications 30, and may use any of a variety of computing structures, arrangements, and compilations to manage applications 30. According to the illustrated embodiment, server system 24 includes a processor 32 operable to execute one or more applications 30.

According to the illustrated embodiment, applications 30 include an optical proximity correction (OPC) module 34, a design rule checker (DRC) 36, and a merging engine 38. Optical proximity correction module 34 may adjust mask pattern 10 to compensate for deviations that may occur during the manufacturing process of an integrated circuit. Deviations may result from, for example, optical diffraction, etch effects, mask-making effects, resist effects, or other effects occurring during the manufacturing process. According to the illustrated embodiment, optical proximity correction module 34 may be used to estimate initial placement of SRAFs 14. The initial positions of SRAFs 14, however, may be estimated in any suitable manner.

Design rule checker 36 applies a set of design rules to a mask pattern and identifies features that violate the applied rules. A design rule may refer to a requirement for a mask pattern to yield a satisfactory mask that yields a satisfactory pattern on a wafer. The rule may pose a geometric requirement. As an example, a rule may define a minimum spacing value between two features. As another example, a rule may define a minimum width value for a feature. Example design rules may include mask rules, SRAF rules, process rules, other suitable rules, or any combination of the preceding.

According to one embodiment, design rule checker 36 may apply rules to a pattern 10 that includes main features 12 in order to estimate initial positions of SRAFs 14. According to the embodiment, a rule may state that if the pitch between two features 12 is x, then a number n of SRAFs may be placed between the two features. For example, if 0<x<360 nanometers, then n=0; 361<x<570 nanometers, then n=1; and 571<x<720 nanometers, then n=2. The initial positions of SRAFs 14, however, may be estimated in any suitable manner.

Merging engine 38 merges SRAFs 14. According to one embodiment, merging engine 38 select certain SRAFs 14 for merging, and uses a merge bar 16 to merge the selected SRAFs 14. Merging engine 38 may merge SRAFs 14 in a manner that at least maintains the process margin of the feature, while at least reducing the possibility of yielding a printed feature on a wafer. Merging engine 38 may use any suitable method to merge SRAFs 14. An example method is described in more detail with reference to FIG. 3.

Database 28 may include any hardware, software, other logic, or combination of the preceding for storing and facilitating retrieval of information used by server system 24. Also, database 28 may use any of a variety of data structures, arrangements, and compilations to store and facilitate retrieval of information used by server system 24.

According to the illustrated embodiment, database 28 stores a mask pattern 40. Mask pattern 40 may represent a pattern for a photolithographic mask for patterning a wafer to produce an integrated circuit. Mask pattern 40 may include main features 12 and SRAFs 14. Mask pattern 40 may be generated from a design that indicates features to be patterned on a wafer. Mask pattern 40 may undergo optical proximity correction processing to compensate for distortions before or after or both before and after SRAFs 14 are merged.

Client system 22, server system 24, and database 28 may operate on one or more computers and may include appropriate input devices, output devices, storage media, processors, memory, or other components for receiving, processing, storing, and communicating information according to the operation of system 20. For example, the functions of client system 22, server system 24, database 28, or any combination of the preceding may be provided using a single computer system, for example, a personal computer. As used in this document, the term "computer" refers to any suitable device operable to execute instructions and manipulate data to perform operations, for example, a personal computer, work station, network computer, wireless telephone, personal digital assistant, one or more microprocessors within these or other devices, or any other suitable processing device.

Modifications, additions, or omissions may be made to system 20 without departing from the scope of the invention. For example, client system 22, server system 24, and database 28 may be integrated or separated according to particular needs. If any of client system 22, server system 24, and database 28 are separated, the separated components may be coupled to each other using a local area network (LAN), a metropolitan area network (MAN), a wide area network (WAN), a global computer network such as the Internet, or any other appropriate wire line, wireless, or other link.

Moreover, the operations of system 20 may be performed by more, fewer, or other modules. For example, the operations of design rule checker 36 and merging engine 38 may be performed by one module, or the operations of merging engine 38 may be performed by more than one module. Additionally, operations of system 10 may be performed using any suitable logic comprising software, hardware, other logic, or any suitable combination of the preceding. As used in this document, "each" refers to each member of a set or each member of a subset of a set.

FIG. 3 is a flowchart illustrating one embodiment of a method for merging SRAFs 14 that may be used by merging engine 38 of FIG. 2. The method begins at step 100, where system 10 receives mask pattern 40. Mask pattern 40 may include main features 12 designed to pattern a wafer. Initial placement of SRAFs 14 is estimated at step 102. SRAFs 14 may be placed to improve the process margin of main features 12. According to one embodiment, design rule checker 32 may be used to estimate the initial positions of SRAFs 14.

SRAFs 14 may include primary and secondary SRAFs 14. Primary SRAFs 14 may have a higher priority than secondary SRAFs 14. A current priority is selected at step 104. The current priority may refer to the highest priority of SRAFs 14 that have not been merged. SRAFs 14 of the current priority are selected to be merged at step 108. The SRAFs 14 may be selected in any suitable manner. For example, SRAFs 14 that violate a rule may be selected. The selected SRAFs 14 are merged at step 112. SRAFs 14 may be merged according to any suitable merging technique. Example merging techniques are described in more detail with reference to FIGS. 4 through 6.

SRAFs 14 of the current priority and SRAFs 14 of a previous priority, if any, are selected to be merged at step 116. A previous priority refers to a priority, if any, selected during a previous iteration. SRAFs 14 may be selected as described with reference to step 108. The selected SRAFs 14 are merged at step 120. SRAFs 14 may be merged as described with reference to step 112.

If there is a next priority level at step 124, the method proceeds to step 128, where the next priority level is set as the current priority level. The method then returns to step 108, where SRAFs 14 of the next priority level are selected to be merged. If there is no next level at step 124, the method proceeds to step 128, where the results are provided. After providing the results, the method terminates.

Modifications, additions, or omissions may be made to the method without departing from the scope of the invention. The method may include more, fewer, or other steps. Additionally, steps may be performed in any suitable order without departing from the scope of the invention.

FIGS. 4A through 6 illustrate example merging techniques for merging SRAFs 210 using a merge bar 212 having a merge bar width w. As discussed above, a merging technique may be selected in accordance with distance d between SRAFs 210. Distance d between SRAFs 210 may refer to the distance in the y-direction between ends of SRAFs 210 that are in closest proximity to each other. According to one embodiment, a positive distance d indicates a separation in the y-direction, and a negative distance d indicates an overlap in the y-direction.

Figure 4A:
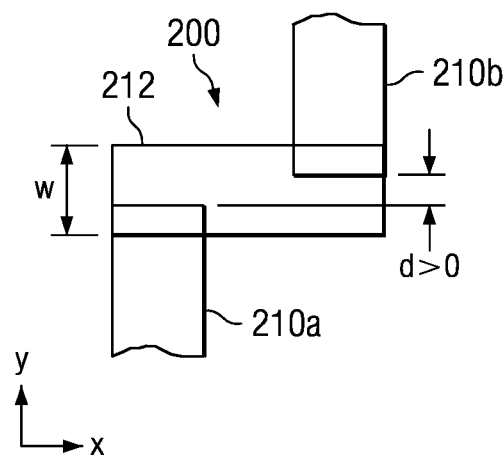

FIG. 4A is a diagram 200 illustrating a first example merging technique for merging SRAFs 210a-b that are separated by a distance d less than merge bar width w. According to the illustrated embodiment, positive distance d indicates a separation in the y-direction between SRAFs 210a-b. The separation by the absolute value of distance d is less than merge bar width w, so SRAFs 210a-b may be merged by coupling proximate ends of SRAFs 210a-b with merge bar 212.

Figure 4B:
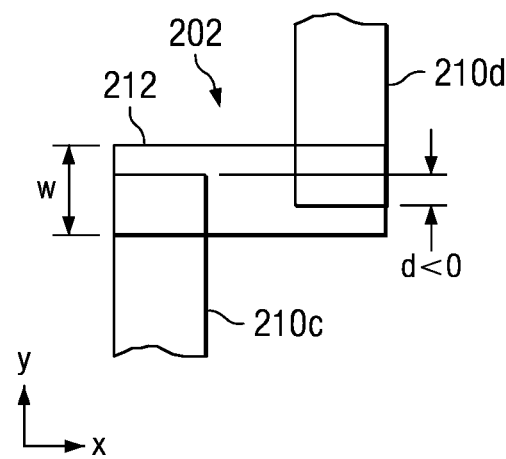
FIG. 4B is a diagram illustrating the first example merging technique for merging SRAFs that overlap by a distance less than the merge bar width.

FIG. 4B is a diagram 202 illustrating the first example merging technique for merging SRAFs 210c-d that overlap by a distance d less than merge bar width w. According to the illustrated embodiment, negative distance d indicates an overlap in the y-direction between SRAFs 210c-d. The overlap by the absolute value of distance d is less than merge bar width w, so SRAFs 210c-d may be merged by coupling proximate ends of SRAFs 210c-d with merge bar 212.

Modifications, additions, or omissions may be made to the first example merging technique without departing from the scope of the invention. The first example merging technique may include more, fewer, or other steps. Additionally, steps may be performed in any suitable order without departing from the scope of the invention.

Figure 5:
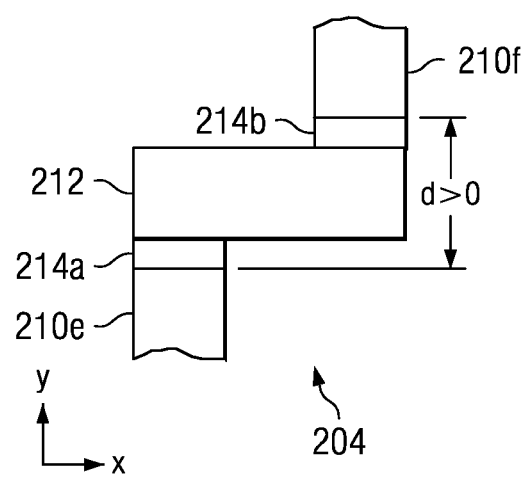

FIG. 5 is a diagram 204 illustrating a second example merging technique for merging SRAFs 210e-f that are separated by a distance d greater than merge bar width w. According to the illustrated embodiment, the positive distance d indicates a separation in the y-direction between SRAFs 210e-f. The separation by the absolute value of distance d is greater than merge bar width w.

To merge SRAFs 210e-f, merge bar 212 may be placed between SRAFs 210e-f. An extension 214a may extend SRAF 210e to couple SRAF 210e to merge bar 212. An extension 214b may extend SRAF 210f to couple SRAF 210f to merge bar 212.

Modifications, additions, or omissions may be made to the second example merging technique without departing from the scope of the invention. The second example merging technique may include more, fewer, or other steps. For example, merge bar 212 may be coupled to an SRAF 210e, and the other SRAF 210f may be extended to couple SRAF 210f to merge bar 212. Additionally, steps may be performed in any suitable order without departing from the scope of the invention. For example, one or more SRAFs 210 may be extended prior to placing merge bar 212 between SRAFs 210.

Figure 6:
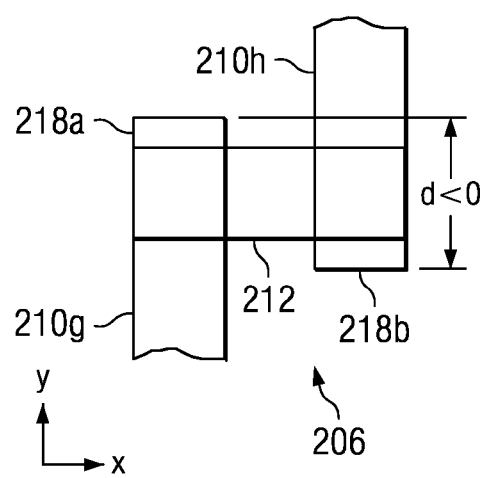

FIG. 6 is a diagram 206 illustrating a third example merging technique for merging SRAFs 210g-h that overlap by a distance d greater than merge bar width w. According to the illustrated embodiment, negative distance d indicates an overlap in the y-direction between SRAFs 210g-h. The overlap by the absolute value of distance d is greater than merge bar width w.

To merge overlapping SRAFs 210g-h, merge bar 212 may be placed on the overlapping ends. One or more portions 218 may be removed from SRAFs 210g-h to shorten the SRAFs 210g-h. For example, portion 218a may be removed from SRAF 210g, and portion 210b may be removed from SRAF 210h.

Modifications, additions, or omissions may be made to the third example merging technique without departing from the scope of the invention. The third example merging technique may include more, fewer, or other steps. For example, merge bar 212 may be coupled to an SRAF 210g, and the other SRAF 210h may be shortened. Additionally, steps may be performed in any suitable order without departing from the scope of the invention. For example, one or more SRAFs 210 may be shortened prior to placing merge bar 212.

Certain embodiments of the invention may provide one or more technical advantages. A technical advantage of one embodiment may be that merging SRAFs may reduce rule violations. Reducing rule violations may yield a wafer pattern that is more readily achieved. Another technical advantage of one embodiment may be that the SRAFs may be merged in a manner that at least reduces the printability of the merged SRAFs. Typically, SRAFs are designed to not print on the wafer. Yet another technical advantage of one embodiment may be that merging SRAFs may yield a mask that is less expensive to produce.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method for merging a plurality of sub-resolution assist features, comprising:
receiving a mask pattern for a photolithographic mask, the mask pattern comprising a plurality of sub-resolution assist features of one or more priorities; and
repeating the following using a computer for each priority of the one or more priorities:
identifying a current set of current sub-resolution assist features to be merged, the current set comprising sub-resolution assist features of a current priority;
merging at least two current sub-resolution assist features according to a merge bar width and a current distance between the at least two current sub-resolution assist features;
updating the current set to yield a next set of next sub-resolution assist features to be merged, the next set comprising at least one sub-resolution assist feature of the current priority and at least one sub-resolution assist feature of a previous priority;
merging at least two next sub-resolution assist features according to the merge bar width and a next distance between the at least two next sub-resolution assist features; and
setting a next priority as the current priority.

2. The method of claim 1, wherein:
a current sub-resolution assist feature has an axis; and
the current distance further comprises a distance measured in a direction substantially parallel to the axis.

3. The method of claim 1 wherein merging the at least two current sub-resolution assist features according to the merge bar width and the current distance further comprises:
identifying a merging technique in accordance with the merge bar width and the current distance; and
merging the at least two distance sub-resolution assist features according to the identified merging technique.

4. Software for merging a plurality of sub-resolution assist features, the software embodied in a computer readable medium and operable to:
receive a mask pattern for a photolithographic mask, the mask pattern comprising a plurality of sub-resolution assist features of one or more priorities; and repeat the following using a computer for each priority of the one or more priorities:
identify a current set of current sub-resolution assist features to be merged, the current set comprising sub-resolution assist features of a current priority;
merge at least two current sub-resolution assist features according to a merge bar width and a current distance between the at least two current sub-resolution assist features;
update the current set to yield a next set of next sub-resolution assist features to be merged, the next set comprising at least one sub-resolution assist feature of the current priority and at least one sub-resolution assist feature of a previous priority;
merge at least two next sub-resolution assist features according to the merge bar width and a next distance between the at least two next sub-resolution assist features; and
set a next priority as the current priority.

5. The software of claim 4, wherein:
a current sub-resolution assist feature has an axis; and
the current distance further comprises a distance measured in a direction substantially parallel to the axis.

6. The software of claim 4, further operable to merge the at least two current sub-resolution assist features according to the merge bar width and the current distance by:
identifying a merging technique in accordance with the merge bar width and the current distance; and
merging the at least two distance sub-resolution assist features according to the identified merging technique.

7. A system for merging a plurality of sub-resolution assist features, comprising:
means for receiving a mask pattern for a photolithographic mask, the mask pattern comprising a plurality of sub-resolution assist features of one or more priorities; and
means for repeating the following for each priority of the one or more priorities:
identifying a current set of current sub-resolution assist features to be merged, the current set comprising sub-resolution assist features of a current priority;
merging at least two current sub-resolution assist features according to a merge bar width and a current distance between the at least two current sub-resolution assist features;
updating the current set to yield a next set of next sub-resolution assist features to be merged, the next set comprising at least one sub-resolution assist feature of the current priority and at least one sub-resolution assist feature of a previous priority;
merging at least two next sub-resolution assist features according to the merge bar width and a next distance between the at least two next sub-resolution assist features; and
setting a next priority as the current priority.

8. A method for merging a plurality of sub-resolution assist features, comprising:
receiving a mask pattern for a photolithographic mask, the mask pattern comprising a plurality of sub-resolution assist features of one or more priorities; and
repeating the following using a computer for each priority of the one or more priorities:
identifying a current set of current sub-resolution assist features to be merged, the current set comprising sub-resolution assist features of a current priority;
merging at least two current sub-resolution assist features according to a merge bar width and a current distance between the at least two current sub-resolution assist features, a current sub-resolution assist feature having an axis, the current distance further comprising a distance measured in a direction substantially parallel to the axis;
updating the current set to yield a next set of next sub-resolution assist features to be merged, the next set comprising at least one sub-resolution assist feature of the current priority and at least one sub-resolution assist feature of a previous priority;
merging at least two next sub-resolution assist features according to the merge bar width and a next distance between the at least two next sub-resolution assist features by:
identifying a merging technique in accordance with the merge bar width and the current distance; and
merging the at least two distance sub-resolution assist features according to the identified merging technique; and
setting a next priority as the current priority.

* * * * *